(12) United States Patent
Braun

(10) Patent No.: US 7,057,253 B2
(45) Date of Patent: Jun. 6, 2006

(54) COMBINATION OF INTRINSIC AND SHAPE ANISOTROPY FOR REDUCED SWITCHING FIELD FLUCTUATIONS

(75) Inventor: Daniel Braun, Ossining, NY (US)

(73) Assignee: Infineon Technologies AG, Munich (DE)

( * ) Notice: Subject to any disclaimer, the term of this patent is extended or adjusted under 35 U.S.C. 154(b) by 281 days.

(21) Appl. No.: 10/465,144

(22) Filed: Jun. 19, 2003

(65) Prior Publication Data

US 2004/0256688 A1    Dec. 23, 2004

(51) Int. Cl.
*H01L 31/107*    (2006.01)

(52) U.S. Cl. .................. 257/438; 257/438; 257/295

(58) Field of Classification Search ............... 257/438, 257/295, 30, 37, 60, 104; 365/171, 173
See application file for complete search history.

(56) References Cited

U.S. PATENT DOCUMENTS

| | | | |
|---|---|---|---|
| 5,650,958 A | 7/1997 | Gallagher et al. | |
| 5,917,749 A | 6/1999 | Chen et al. | |
| 6,104,633 A * | 8/2000 | Abraham et al. | 365/171 |
| 2003/0063492 A1 | 4/2003 | Ruhrig et al. | |
| 2004/0109346 A1 * | 6/2004 | Smith et al. | 365/158 |

OTHER PUBLICATIONS

Braun, D. "Effect of crystalline disorder on magnetic switching in small magnetic cell," Journal of Magnetism and Magnetic Materials (2003), vol. 261, pp. 295-303, Elsevier Science B.V.

Zheng, Youfeng, et al. "Effect of grain size and crystalline orientation on magnetic switching," Journal of Applied Physics (1999), vol. 85, No. 8, pp. 4776-4778, American Institute of Physics.

\* cited by examiner

*Primary Examiner*—David Neims
*Assistant Examiner*—Thinh T Nguyen
(74) *Attorney, Agent, or Firm*—Slater & Matsil, L.L.P.

(57) ABSTRACT

A magnetic memory cell and method of manufacturing thereof, wherein the angle between the shape anisotropy axis and the intrinsic anisotropy axis of the magnetic material layer is optimized to minimize fluctuations in the switching field. The angle between shape anisotropy axis and intrinsic anisotropy axis is preferably between 45 and less than 90 degrees. Magnetic layers may be used having increased thickness, resulting in increased activation energy. Magnetic memory cells may be manufactured that are more stable for long term storage and have improved write margins.

13 Claims, 2 Drawing Sheets

COMBINATION OF INTRINSIC AND SHAPE ANISOTROPY FOR REDUCED SWITCHING FIELD FLUCTUATIONS

TECHNICAL FIELD

The present invention relates generally to the fabrication of semiconductor devices, and more particularly to the fabrication of magnetic random access memory (MRAM) devices.

BACKGROUND

A more recent development in memory devices involves spin electronics, which combines semiconductor technology and magnetics. The spin of an electron, rather than the charge, as in dynamic random access memory (DRAM) devices, is used to indicate the presence of a "1" or "0".

One such spin electronic device is a magnetic random access memory (MRAM), which includes conductive lines positioned in a different direction, e.g., perpendicular to one another in different metal layers, the conductive lines sandwiching a magnetic stack or magnetic tunnel junction (MJT), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic memory cell depends on the moment's alignment. The stored state is read from the magnetic memory cell by detecting the component's resistive state.

An advantage of MRAMs compared to traditional semiconductor memory devices such as DRAMs is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data. Therefore, MRAM devices are replacing flash memory, DRAM and static random access memory devices (SRAM) devices in electronic applications where a memory device is needed.

A magnetic stack comprises many different layers of metals and magnetic metals, and a thin layer of dielectric material having a total thickness of a few tens of nanometers. The magnetic stacks are typically built on top of copper wires embedded in an inter-level dielectric (ILD) material. The magnetic tunnel junctions (MTJ's) are positioned at intersections of underlying first conductive lines and overlying second conductive lines. MRAM devices are typically manufactured by forming a plurality of magnetic metal stacks arranged in an array, which comprise the magnetic memory cells. A memory cell array typically has conductive lines in a matrix structure having rows and columns.

One type of MRAM array uses a transistor to select each magnetic memory cell. Another type, a cross-point array, comprises an array of magnetic bits or magnetic stacks situated at the cross-points between two conductive lines. Information is stored in one of the magnetic layers of the magnetic stacks. To store the information, a magnetic field is necessary. In a cross-point array, this magnetic field is provided by a wordline and bitline current which is passed through conductive lines. Information is stored in the magnetic memory cells by aligning the magnetization of one ferromagnetic layer (the information layer or free layer) either parallel or antiparallel to a second magnetic layer (the reference layer or fixed layer). The information is detectable due to the fact that the resistance of the element in the parallel case is different from the antiparallel case. Magnetic stacks or memory cells in a cross-point array are usually selected by passing sub-threshold currents through the conductive lines, e.g., in both the x- and y-direction, and where the conductive lines cross at the cross-points, the combined magnetic field is large enough to change the magnetic orientation.

The switching of magnetic memory cells is affected by the geometric shape of the magnetic memory cells, and also by the intrinsic magnetic properties of the magnetic materials used to manufacture the magnetic memory cells. The length is commonly different than the width of the magnetic memory cell, so that the magnetic field tends to align along the length, which is referred to as shape anisotropy. Due to the crystalline properties of the magnetic materials used for the magnetic memory cells, the magnetic field tends to align in a direction parallel to the axis of the crystal structure, which is referred to as magnetic or intrinsic anisotropy.

In U.S. Pat. No. 5,917,749 entitled "MRAM Cell Requiring Low Switching Field," which is hereby incorporated herein by reference, the shape anisotropy easy axis of an MRAM cell is positioned perpendicular to the magnetic anisotropy easy axis in order to cause the magnetic anisotropy to subtract from the shape anisotropy and reduce the cell switching field. However, an MRAM cell produced in this manner results in high switching field fluctuations from cell to cell in an array. For example, a switching magnetic field of between 40 to 50 Oersteds may be required to switch the various cells of an MRAM array. Ten Oersteds is a large amount of fluctuation, which can result in lost data or in memory cells being written to unintentionally.

What is needed in the art is a method of manufacturing a magnetic memory device that has reduced switching field fluctuations for the magnetic memory cells in an array.

SUMMARY OF THE INVENTION

These and other problems are generally solved or circumvented, and technical advantages are generally achieved, by preferred embodiments of the present invention which provide a magnetic memory cell structure and method of manufacturing thereof wherein the intrinsic and shape anisotropy axes of a magnetic memory cell are combined, with the intrinsic anisotropy axis being oriented with respect to the shape anisotropy axis at an optimized angle such that the effect of fluctuations of the shape anisotropy are suppressed to linear order in the switching field. The free layer combines both intrinsic and shape anisotropy oriented at an angle of 45 degrees to less than 90 degrees, allowing cell sizes to be scaled or decreased, by increasing the layer thickness and decreasing the aspect ratio and/or width.

In accordance with a preferred embodiment of the present invention, a magnetic memory cell includes a first magnetic layer, a tunnel junction disposed over and abutting the first magnetic layer, and a second magnetic layer disposed over and abutting the tunnel junction. The magnetic memory cell comprises a first anisotropy axis and a second anisotropy axis, wherein an angle between the first anisotropy axis and second anisotropy axis is non-perpendicular.

In accordance with another preferred embodiment of the present invention, an MRAM device includes at least one magnetic memory cell, the magnetic memory cell comprising a fixed layer, a tunnel junction disposed over and abutting the fixed layer, and a free layer disposed over and abutting the tunnel junction. The magnetic memory cell includes a first anisotropy axis and a second anisotropy axis, wherein an angle between the first anisotropy axis and second anisotropy axis is non-perpendicular.

In accordance with yet another preferred embodiment of the present invention, a method of fabricating a magnetic memory device includes disposing a first magnetic layer over a workpiece, disposing a tunnel junction over and abutting the first magnetic layer, and disposing a second magnetic layer over and abutting the tunnel junction. The first magnetic layer, tunnel junction and second magnetic layer comprise a magnetic memory cell. The magnetic memory cell includes a first anisotropy axis and a second anisotropy axis, wherein the second anisotropy axis is non-perpendicular to the first anisotropy axis.

An advantage of a preferred embodiment of the present invention includes the reduction of fluctuations in the switching field required for an array of magnetic in memory cells, by improving process homogeneity, lithography performance, etch performance and material homogeneity. Magnetic memory cells can be made of a thicker material, having a smaller length and width, resulting in increased array density and more memory cells per unit area. By orienting the intrinsic anisotropy axis and shape anisotropy axis at an optimum angle, between 45 and less than 90 degrees, the switching field fluctuations are reduced, in accordance with embodiments of the invention. Magnetic layers having increased thickness results in increased activation energy. Magnetic memory cells may be manufactured that are more stable for long term storage and have improved write margins.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM memory device. Embodiments of the invention may also be applied, however, to other magnetic memory cells and structures.

Figure 1:
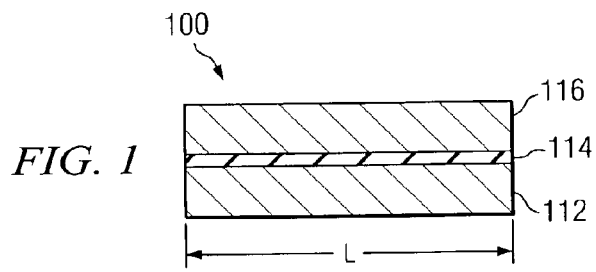
FIG. 1 shows a cross-sectional view of a magnetic memory cell such as an MRAM device.

FIG. 1 shows a cross-sectional view of a magnetic memory cell 100 in accordance with an embodiment of the present invention. The magnetic memory cell 100 comprises a semiconductor wafer comprising a workpiece, not shown. The workpiece may comprise one or more layers of a dielectric such as silicon oxide or low-k materials disposed over silicon single-crystal silicon, for example. The workpiece may include conductive layers, e.g., wordlines or bitlines, or other semiconductor elements, such as transistors, or diodes, as examples.

The magnetic memory cell 100 comprises a first magnetic layer 112 disposed over the workpiece. The first magnetic layer 112 may comprise a fixed layer (also referred to as a reference layer) that will be fixed in a predetermined magnetic direction, for example. The first magnetic layer 112 may comprise a layer of TaN, a layer of NiFe, and one or more optional additional magnetic or non-magnetic layers, for example.

The magnetic memory cell 100 includes a tunnel junction or tunnel barrier layer 114 disposed over and abutting the first magnetic layer 112. The tunnel junction 114 preferably comprises an insulating layer, and may comprise AlO, for example.

The magnetic memory cell 100 includes a second magnetic layer 116 disposed over and abutting the tunnel junction 114. The second magnetic layer 116 may comprise a free layer that will be allowed to switch magnetization directions, depending on the logic state of the magnetic memory cell 100. The second magnetic layer 116 may comprise a layer of CoFe, a layer of Ru, a layer of CoFe, and optional additional magnetic layers, for example.

Figure 2:
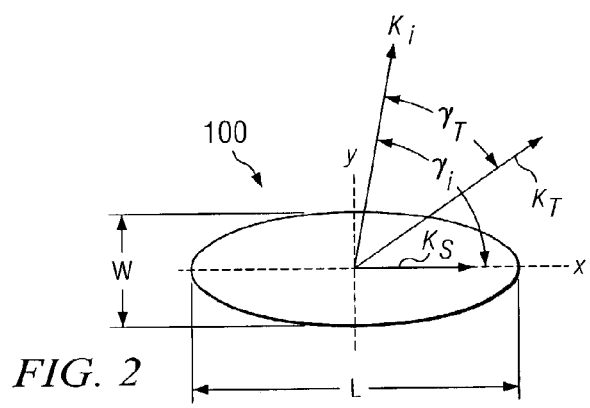
FIG. 2 shows a perspective view of the magnetic memory cell of FIG. 1, including vectors indicating the shape anisotropy axis and the intrinsic anisotropy axis, and the angle between the shape and intrinsic anisotropy axes in accordance with an embodiment of the present invention.

The magnetic memory cell 100 has a length L that is greater than the width W, as shown in a perspective view in FIG. 2. The magnetic memory cell 100 may be oval or elliptical in shape, as shown, although alternatively, the magnetic memory cell 100 may comprise a rectangular shape or other shapes, for example.

FIG. 2 includes vectors indicating the axes of two anisotropic magnetic properties of the memory cell 100. As described herein, the value $K_x$ (where x=s for shape or i for intrinsic) represents a numerical value, wherein the value indicates how anisotropic the parameter is: the greater the $K_x$ value, the more resistant the magnetization is to move out of the preferred direction of vector $K_x$.

The vector $K_s$ shown in FIG. 2 represents the shape anisotropy axis (or easy axis) and indicates the preferred direction of the magnetic field along the x axis due to the shape of the memory cell 100, having a length L greater than the width W. The vector $K_i$ is the intrinsic anisotropy axis (or easy axis) indicating the preferred direction of the magnetic field in a direction $K_i$ in the plane of the paper, e.g., in the x-y plane due to the material properties of the free layer 116 (not shown in FIG. 2: see FIG. 1) of the memory cell 100. The shape anisotropy $K_s$ may be 30 Oe and the intrinsic anisotropy $K_i$ may be 50 Oe, as examples.

In accordance with embodiments of the present invention, the magnetic memory cell 100 is manufactured with an angle $\gamma_i$ between the shape anisotropy axis $K_s$ and the intrinsic anisotropy axis $K_i$, wherein the angle $\gamma_i$ is selected in order to reduce switching fluctuations for a plurality of magnetic memory cells of a memory array. The determination of the angle $\gamma_i$ and other parameters of the magnetic memory cell 100 such as the total anisotropy axis $K_T$ and the angle $\gamma_T$ between the total anisotropy axis $K_T$ and the intrinsic anisotropy axis $K_i$ will be described further herein.

There is a trend in the semiconductor industry to decrease feature sizes of electronic components, to increase speed and decrease power consumption. With decreasing magnetic memory cell 100 sizes, there are two dilemmas in MRAM device design: 1) increased switching field and 2) increased activation energy required to switch the cells as the switching field increases. The switching field $H_c$ of a free layer 116 of a magnetic memory cell 100 (see FIG. 1) is calculated using Eq. 1:

$$H_c = M_s t / W(1 - 1/r) \quad \text{Eq. 1:}$$

where t is the thickness, W the width, and r the aspect ratio (length L/width W) and $M_s$ the saturation magnetization of the free layer 116. The activation energy $E_a$ is related to the switching field as the single domain approximate, and the activation energy $E_a$ is required to be accurate for small magnetic memory cells or MTJs. The activation energy $E_a$ may be calculated using Eq. 2:

$$E_a = H_c V M_s / 2; \quad \text{Eq. 2:}$$

where the volume V is calculated using Eq. 3:

$$V = t W^2 r; \quad \text{Eq. 3:}$$

The activation energy $E_a$ scales similarly as the width W of the MTJ scales for small MTJs, which is disastrous for thermal stability at small widths. If the aspect ratio is reduced when scaling down MTJs, this increases the switching field fluctuations for magnetic memory cells in an array, and therefore reducing the aspect ratio not provide a solution to the dilemma.

In principle, the use of intrinsic anisotropy would solve the problem, in the sense that the switching field arising from the intrinsic anisotropy $K_i$ is a material constant, independent of size and shape of the cell. When intrinsic anisotropy is used, the switching field is calculated using Eq. 4:

$$H_{ci} = 2 K_i / M_s \quad \text{Eq. 4:}$$

Thus, by increasing the thickness t of the magnetic memory cell inversely proportional to the shrinking width W, the cell size may be reduced, while keeping at the same time both the switching field and the activation energy constant. That would be true, if intrinsic anisotropy alone contributed to the anisotropy of the magnetic memory cell, meaning that no shape anisotropy could be present in the magnetic memory cells, or that the width W must be the same as the length L (e.g., a circular or round magnetic memory cell would be required).

However, it is not feasible to manufacture a round magnetic memory cell having no shape anisotropy. Because of lithography and processing limitations, attempting to manufacture round cells results in magnetic memory cells in an array that are not perfectly round, but have fluctuating shapes, thus leading to high switching field fluctuations from cell to cell in the array. Switching field fluctuations are particularly pronounced for aspect ratios close to 1, i.e., circular shapes, for example.

Embodiments of the present invention overcome the problem of switching field fluctuation induced by fluctuating shapes for cells with dominating intrinsic anisotropy, and thus allow the scaling of smaller cells using intrinsic anisotropy. Referring to the article by D. Braun, entitled, "Effect of crystalline disorder on magnetic switching in small magnetic cell," Journal of Magnetism and Magnetic Materials (2003), Vol. 261, pp. 295–303, which is incorporated herein by reference, the resulting total anisotropy $K_T$ from both intrinsic anisotropy $K_i$ and shape anisotropy $K_s$ is given by Eq. 5:

$$K_T = \sqrt{K_i^2 + K_s^2 + 2 K_i K_s \cos(2\gamma_i)} \quad \text{Eq. 5:}$$

where $\gamma_i$ is the angle of the intrinsic anisotropy axis $K_i$ relative to the shape anisotropy axis $K_s$. Therefore, if $K_s$ fluctuates by $\delta K_s$, due to fluctuations of whatever origin (mostly, due to size and aspect ratio), the fluctuations of $K_T$ are given by Eq. 6:

$$\delta K = [(K_s + K_i \cos(2\gamma_i))/\sqrt{K_i^2 + K_s^2 + 2 K_i K_s \cos(2\gamma_i)}] \delta K_s \quad \text{Eq. 6:}$$

Thus, in accordance with an embodiment of the invention, in order to make the numerator of Eq. 6 equal to zero, preferably, the angle $\gamma_i$ is chosen as, or selected to be equal to an angle that is approximately calculated by Eq. 7:

$$\text{Eq. 7:}$$
$$\gamma_i = \frac{1}{2} \arccos(-K_s / K_i),$$

so that the fluctuations of the shape anisotropy will not contribute in a linear order to the fluctuations of the switching field. The angle $\gamma_i$ is an angle ranging from 45 degrees to less than 90 degrees, e.g., approximately 45 to 89 degrees. Thus, in accordance with embodiments of the present invention, a finite aspect ratio of the magnetic memory cells may be kept in an array, such that the shape anisotropy axis $K_s$ has a well-defined direction, but the intrinsic anisotropy is oriented at the angle $\gamma_i$ relative to the shape anisotropy axis $K_s$.

The resulting total anisotropy $K_T$ is reduced when this optimal angle $\gamma_i$ is used. The resulting total anisotropy $K_T$ may be calculated using Eq. 8:

$$K_T = \sqrt{K_i^2 - K_s^2} \quad \text{Eq. 8:}$$

Reducing the total anisotropy $K_T$ in accordance with embodiments of the present invention results in reducing both the required switching field for memory cells of the array, and also, proportionally reducing the activation energy. Now it is possible to increase the thickness of the free layer 116 (see FIG. 1) and also to decrease the aspect ratio L/W (see FIG. 2) in order to keep the shape anisotropy axis $K_s$ (and thus the total anisotropy axis $K_T$ and the total switching field) constant, as well as keeping the total volume V and hence the activation energy constant, without having to be concerned about increased fluctuations of the switching field, because they are not effective in the total anisotropy $K_T$.

Orienting the intrinsic anisotropy axis $K_i$ of the magnetic memory cell 100 at an angle $\gamma_i$ with respect to the shape anisotropy axis $K_s$ in accordance with embodiments of the present invention results in a preferred orientation $\gamma_T$ of the magnetization of the free layer. The angle $\gamma_T$ between the total anisotropy axis $K_T$ and the intrinsic anisotropy axis $K_i$ is calculable using Eq. 9:

Eq. 9:
$$\gamma_T = \frac{1}{2}\sin(\gamma_i)\arccos\left(\frac{K_s + K_i\cos(2\gamma_i)}{K_T}\right)$$

Figure 3:
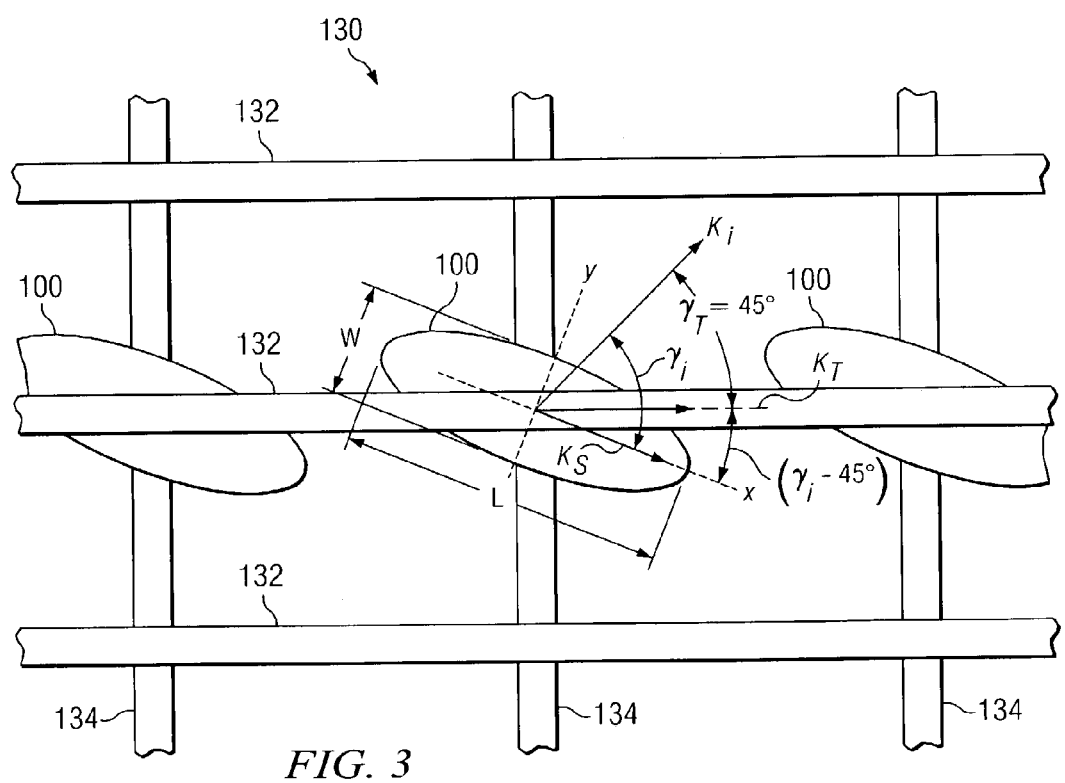
FIG. 3 illustrates an array of magnetic memory cells oriented in the direction of the total anisotropy axis along a wordline or bitline in accordance with an embodiment of the present invention.
Figure 4:
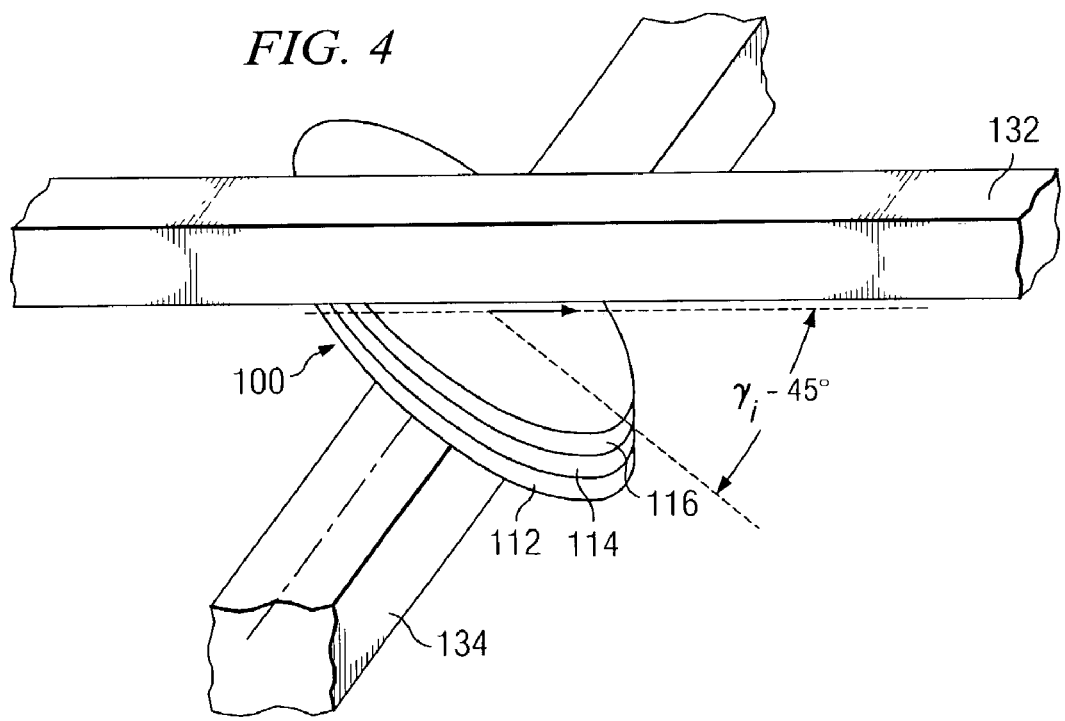
FIG. 4 shows a perspective view of a magnetic memory cell in the array of FIG. 3.

Thus, under optimized angle of the intrinsic anisotropy relative to the shape anisotropy, the angle $\gamma_T$ is preferably 45 degrees, in accordance with a preferred embodiment of the present invention. The reference layer or fixed layer 112 (see FIG. 1) should be oriented accordingly relative to the cell 100. Therefore, to keep magnetic select, (e.g., the switching mechanism described above, wherein both the fields from the wordline 132 and bitline 134 are needed to switch or select a cell to be written), the entire tunnel junction 114 of each magnetic memory cell 100 in an array is preferably rotated by ($\gamma_i$–45) degrees relative to the wordline 132, as shown in a top view in FIG. 3, and the reference or fixed layer 112 is kept parallel to the wordline 132, as shown in a perspective view in FIG. 4. Note that the magnetization of the reference layer 112 is strongly pinned to an anti-ferromagnet, so the shape and orientation of the reference layer 112 are not significant. Thus, in accordance with an embodiment of the invention, the entire magnetic memory cell 100 is patterned as usual, but the magnetic memory cell 100 is rotated, while the magnetization of the reference layer 112 (not shown) is kept parallel to the wordline 132.

Figure 5:
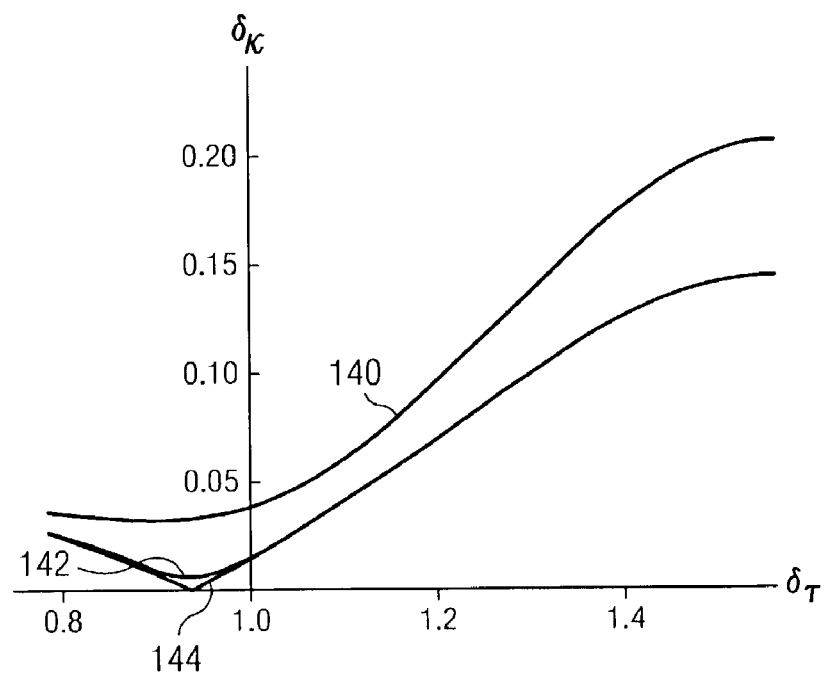
FIG. 5 is a graph showing the reduction in switching field fluctuations as a result of embodiments of the present invention.

FIG. 5 is a graph showing the reduction in switching field fluctuations as a result of embodiments of the present invention. By selecting an angle $\gamma_i$ between the intrinsic anisotropy axis $K_i$ and the shape anisotropy axis $K_s$ that causes $\delta K$ to equal zero, such as angle $\gamma_i$ calculated using Eq. 7 above, the switching field fluctuation $\delta K$ is minimized, as shown in the calculated results for cells in an array at 140, 142, and 144.

While embodiments of the present invention have been described herein with reference to shape anisotropy and intrinsic anisotropy; however, embodiments of the invention may also be applied generally in magnetic memory cells having two different types of anisotropy present in the design. For example, parameters that may be anisotropic may include shape, intrinsic or material, or magnetic restriction (wherein a material restricts or is shrunk when it is magnetized), as examples, although other types of anisotropic parameters may be optimized in accordance with embodiments of the present invention.

Advantages of embodiments of the invention include reducing fluctuations in the switching field required for an array of magnetic memory cells, by improving process homogeneity, lithography performance, etch performance and material homogeneity. Magnetic memory cells can be made of a thicker material, having a smaller length and width, resulting in increased array density and more memory cells per unit area. This is advantageous because the activation energy is increased, because the volume is increased, resulting in a memory cell that is more stable for long term storage and has improved write margins. By orienting the intrinsic anisotropy axis and shape anisotropy axis at an optimum angle, preferably between 45 and less than 90 degrees, the switching field fluctuations are reduced, in accordance with embodiments of the invention.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A magnetic memory cell, comprising:
a first magnetic layer;
a tunnel junction disposed over and abutting the first magnetic layer; and
a second magnetic layer disposed over and abutting the tunnel junction, wherein the magnetic memory cell comprises a first anisotropy axis and a second anisotropy axis, and wherein an angle between the first anisotropy axis and second anisotropy axis is non-perpendicular, wherein the first anisotropy axis comprises a shape anisotropy axis $K_s$, wherein the second anisotropy axis comprises an intrinsic anisotropy axis $K_i$, and wherein the intrinsic anisotropy axis $K_i$ is positioned in a direction $\gamma_i$ relative to the shape anisotropy axis $K_s$ and wherein the direction $\gamma_i$ is defined approximately by the equation:

$$\gamma_i = \frac{1}{2}\arccos(-K_s/K_i).$$

2. The magnetic memory cell according to claim 1, wherein the angle between the first anisotropy axis and the second anisotropy axis is between approximately 45 and less than 90 degrees.

3. The magnetic memory cell according to claim 2, wherein the angle between the first anisotropy axis and the second anisotropy axis is selected to minimize switching field fluctuations of the magnetic memory cell.

4. The magnetic memory cell according to claim 1, wherein the magnetic memory cell has a total anisotropy $K_T$ positioned in a direction $\gamma_T$ relative to the intrinsic anisotropy axis $K_i$, wherein:

$$K_T = \sqrt{K_i^2 - K_N^2}; \text{ and}$$

$$\gamma_T = \frac{1}{2}\sin(\gamma_i)\arccos\left(\frac{K_s + K_i\cos(2\gamma_i)}{K_T}\right).$$

5. The magnetic memory cell according to claim 1, wherein the magnetic memory cell comprises a magnetic random access memory (MRAM).

6. The magnetic memory cell according to claim 1, wherein the first anisotropy axis and the second anisotropy axis comprise shape, intrinsic, or magnetic restriction anisotropy axes.

7. A magnetic random access memory (MRAM) device, comprising: at least one magnetic memory cell, the magnetic memory cell comprising a fixed layer, a tunnel junction disposed over and abutting the fixed layer, and a free layer disposed over and abutting the tunnel junction, wherein the magnetic memory cell comprises a first anisotropy axis and a second anisotropy axis, and wherein an angle between the first anisotropy axis and second anisotropy axis is non-perpendicular, wherein the first anisotropy axis comprises a shape anisotropy axis $K_s$, wherein the second anisotropy axis comprises an intrinsic anisotropy axis $K_i$, and wherein the intrinsic anisotropy axis $K_i$ is positioned in a direction $\gamma_i$ relative to the shape anisotropy axis $K_s$, and wherein the direction $\gamma_i$ is defined approximately by the equation:

$$\gamma_i = \frac{1}{2}\arccos(-K_s/K_i).$$

8. The MRAM device according to claim 7, wherein the angle between the first anisotropy axis and the second anisotropy axis is between approximately 45 and less than 90 degrees.

9. The MRAM device according to claim 8, wherein the angle between the first anisotropy axis and the second anisotropy axis is selected to minimize switching field fluctuations of the magnetic memory cell.

10. The MRAM device according to claim 7, wherein the MRAM device comprises an array of magnetic memory cells, further comprising a first conductive line running in a first direction disposed proximate the fixed layer of each magnetic memory cell, and a second conductive line running in a second direction disposed proximate the free layer of each magnetic memory cell, the second direction being different from the first direction, wherein each magnetic memory cell in the array is rotated at an angle of $(\gamma_t - 45)$ degrees from the second conductive line.

11. The MRAM device according to claim 7, wherein the magnetic memory cell has a toatal anisotropy axis $K_T$ positioned in a direction $\gamma_T$ relative to the intrinsic anisotropy axis $K_b$, wherein:

$$K_T = \sqrt{K_i^2 - K_s^2}; \text{ and}$$

$$\gamma_T = \frac{1}{2}\sin(\gamma_i)\arccos\left(\frac{K_s + K_i\cos(2\gamma_i)}{K_T}\right).$$

12. The MRAM device according to claim 11, wherein the MRAM device comprises an array of magnetic memory cells, further comprising a first conductive line running in a first direction disposed proximate the fixed layer of each magnetic memory cell, and a second conductive line running in a second direction disposed proximate the free layer of each magnetic memory cell, the second direction being different from the first direction, wherein each magnetic memory cell in the array is positioned along one of the first or second conductive lines along the total anisotropy axis $K_T$.

13. The MRAM device according to claim 7, wherein the first anisotropy axis and the second anisotropy axis comprise shape, intrinsic, or magnetic restriction anisotropy axes.

* * * * *